(12) United States Patent
Mudakatte et al.

(10) Patent No.: US 10,141,908 B2
(45) Date of Patent: Nov. 27, 2018

(54) MULTI-DENSITY MIM CAPACITOR FOR IMPROVED PASSIVE ON GLASS (POG) MULTIPLEXER PERFORMANCE

(71) Applicant: QUALCOMM Incorporated, San Diego, CA (US)

(72) Inventors: Niranjan Sunil Mudakatte, San Diego, CA (US); David Francis Berdy, San Diego, CA (US); Changhan Hobie Yun, San Diego, CA (US); Chengjie Zuo, San Diego, CA (US); Shiqun Gu, San Diego, CA (US); Mario Francisco Velez, San Diego, CA (US); Jonghae Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 91 days.

(21) Appl. No.: 15/240,987

(22) Filed: Aug. 18, 2016

(65) Prior Publication Data
US 2018/0054177 A1  Feb. 22, 2018

(51) Int. Cl.
*H03H 1/00* (2006.01)
*H03H 7/01* (2006.01)
*H03H 7/46* (2006.01)
*H01L 49/02* (2006.01)
*H05K 1/16* (2006.01)
*H05K 1/03* (2006.01)

(52) U.S. Cl.
CPC ........... *H03H 7/0115* (2013.01); *H01L 28/10* (2013.01); *H01L 28/40* (2013.01); *H03H 1/0007* (2013.01); *H03H 7/0138* (2013.01); *H03H 7/46* (2013.01); *H05K 1/162* (2013.01); *H05K 1/165* (2013.01); *H03H 2001/0078* (2013.01); *H03H 2001/0085* (2013.01); *H05K 1/0306* (2013.01); *H05K 2201/09263* (2013.01); *H05K 2201/09281* (2013.01)

(58) Field of Classification Search
CPC .................................................... H03H 7/0115
USPC ......................................................... 333/100
See application file for complete search history.

(56) References Cited

U.S. PATENT DOCUMENTS 6,127,908 A * 10/2000 Bozler .................. B81B 3/0021
                                                        330/66
7,078,310 B1    7/2006 Kar-Roy et al.
(Continued)

FOREIGN PATENT DOCUMENTS

FR        2577067 A1    8/1986
WO     2006076607 A1    7/2006
(Continued)

OTHER PUBLICATIONS

Partial International Search Report—PCT/US2017/041961—ISA/EPO—dated Dec. 5, 2017.
(Continued)

*Primary Examiner* — Stephen E. Jones
*Assistant Examiner* — Samuel S Outten
(74) *Attorney, Agent, or Firm* — Seyfarth Shaw LLP

(57) ABSTRACT

A passive device may include an inductor having interconnected trace segments. The passive device may also include parallel plate capacitors. Each of the plurality of parallel plate capacitors may have a dielectric layer between a pair of conductive plates. The parallel plate capacitors may not overlap more than one of the interconnected trace segments.

21 Claims, 10 Drawing Sheets

(56) References Cited

U.S. PATENT DOCUMENTS

| | | |
|---|---|---|
| 8,191,217 B2 | 6/2012 | Dunn et al. |
| 8,857,022 B2 | 10/2014 | Dunn et al. |
| 2005/0141169 A1 | 6/2005 | Yamasaki |
| 2007/0126529 A1* | 6/2007 | Chen ........................ H03H 1/00 |
| | | 333/185 |
| 2007/0209178 A1 | 9/2007 | Savic et al. |
| 2009/0161294 A1 | 6/2009 | Kim et al. |
| 2010/0052813 A1* | 3/2010 | Okabe .................... H03H 7/463 |
| | | 333/132 |
| 2010/0321858 A1 | 12/2010 | Hsu et al. |
| 2011/0018654 A1* | 1/2011 | Bradley ................. H03H 9/706 |
| | | 333/133 |
| 2013/0140677 A1 | 6/2013 | Chu et al. |
| 2014/0159201 A1* | 6/2014 | Keller ................. H01L 23/5223 |
| | | 257/532 |
| 2015/0200245 A1 | 7/2015 | Yun et al. |
| 2016/0014903 A1 | 1/2016 | Kato et al. |
| 2016/0050757 A1 | 2/2016 | Diao et al. |

FOREIGN PATENT DOCUMENTS

| | | |
|---|---|---|
| WO | 2007005642 A2 | 1/2007 |
| WO | 2011118307 A1 | 9/2011 |
| WO | 2011118308 A1 | 9/2011 |

OTHER PUBLICATIONS

International Search Report and Written Opinion—PCT/US2017/041961—ISA/EPO—dated May 8, 2018.

* cited by examiner

MULTI-DENSITY MIM CAPACITOR FOR IMPROVED PASSIVE ON GLASS (POG) MULTIPLEXER PERFORMANCE

BACKGROUND

Field

Aspects of the present disclosure relate to semiconductor devices, and more particularly to a multi-density metal-insulator-metal (MIM) capacitor for improved passive on glass (POG) multiplexer performance.

Background

One goal driving the wireless communication industry is providing consumers with increased bandwidth. The use of carrier aggregation in current generation communications provides one possible solution for achieving this goal. Carrier aggregation enables a wireless carrier, having licenses to two frequency bands (e.g., 700 MHz and 2 GHz) in a particular geographic area, to maximize bandwidth by simultaneously using both frequencies for a single communication stream. While an increased amount of data is provided to the end user, carrier aggregation implementation is complicated by noise created at the harmonic frequencies due to the frequencies used for data transmission. For example, 700 MHz transmissions may create harmonics at 2.1 GHz, which interfere with data broadcast at 2 GHz frequencies.

For wireless communication, passive devices are used to process signals in a carrier aggregation system. In carrier aggregation systems, signals are communicated with both high band and low band frequencies. In a chipset, a passive device (e.g., a diplexer) is usually inserted between an antenna and a tuner (or a radio frequency (RF) switch) to ensure high performance. Usually, a diplexer design includes inductors and capacitors. Diplexers can attain high performance by using inductors and capacitors that have a high quality (Q)-factor. High performance diplexers can also be attained by reducing the electromagnetic coupling between components, which may be achieved through an arrangement of the geometry and direction of the components.

Mobile RF chip designs (e.g., mobile RF transceivers), including high performance multiplexers have migrated to a deep sub-micron process node due to cost and power consumption considerations. The design of such mobile RF transceivers becomes complex at this deep sub-micron process node. The design complexity of these mobile RF transceivers is further complicated by added circuit functions to support communication enhancements, such as carrier aggregation. Further design challenges for mobile RF transceivers include analog/RF performance considerations, including mismatch, noise and other performance considerations. The design of these mobile RF transceivers includes the use of additional passive devices, for example, to suppress resonance, and/or to perform filtering, bypassing and coupling.

Passive on glass devices involve high-performance inductor and capacitor components that have a variety of advantages over other technologies, such as surface mount technology or multi-layer ceramic chips that are commonly used in the fabrication of mobile radio frequency (RF) chip designs. The design complexity of mobile RF transceivers is complicated by the migration to a deep sub-micron process node due to cost and power consumption considerations. Spacing considerations also affect mobile RF transceiver design deep sub-micron process nodes, such as large capacitor, which may cause a performance bottle-neck during design integration of RF multiplexers.

SUMMARY

A passive device may include an inductor having interconnected trace segments. The passive device may also include parallel plate capacitors. Each of the plurality of parallel plate capacitors may have a dielectric layer between a pair of conductive plates. The parallel plate capacitors may not overlap more than one of the interconnected trace segments.

A passive device may include a set of metal-insulator-metal (MIM) capacitors in a common plane. A first MIM capacitor of the set of MIM capacitors may include a first single layer of dielectric material of a first dielectric constant and a second MIM capacitor of the set of MIM capacitors. The capacitors may further include a second, single layer of dielectric material of a second dielectric constant that differs from the first dielectric constant.

A passive device may include a set of metal-insulator-metal (MIM) capacitors in a common plane. A first capacitor may have a first dielectric thickness and a first dielectric constant of a first dielectric layer. A second capacitor may also have a second dielectric thickness of a second dielectric layer. The first dielectric thickness may differ from the second dielectric thickness. The first dielectric layer and the second dielectric layer are of the same material.

A radio frequency (RF) front end module may include a multiplexer. The multiplexer may include an inductor having interconnected trace segments, and parallel plate capacitors. Each of the plurality of parallel plate capacitors has a dielectric layer between a pair of conductive plates. Each of the of the parallel plate capacitors overlaps no more than one of the interconnected trace segments. The RF front end module may also include an antenna coupled to an output of the multiplexer This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

DETAILED DESCRIPTION

Figure 1A:
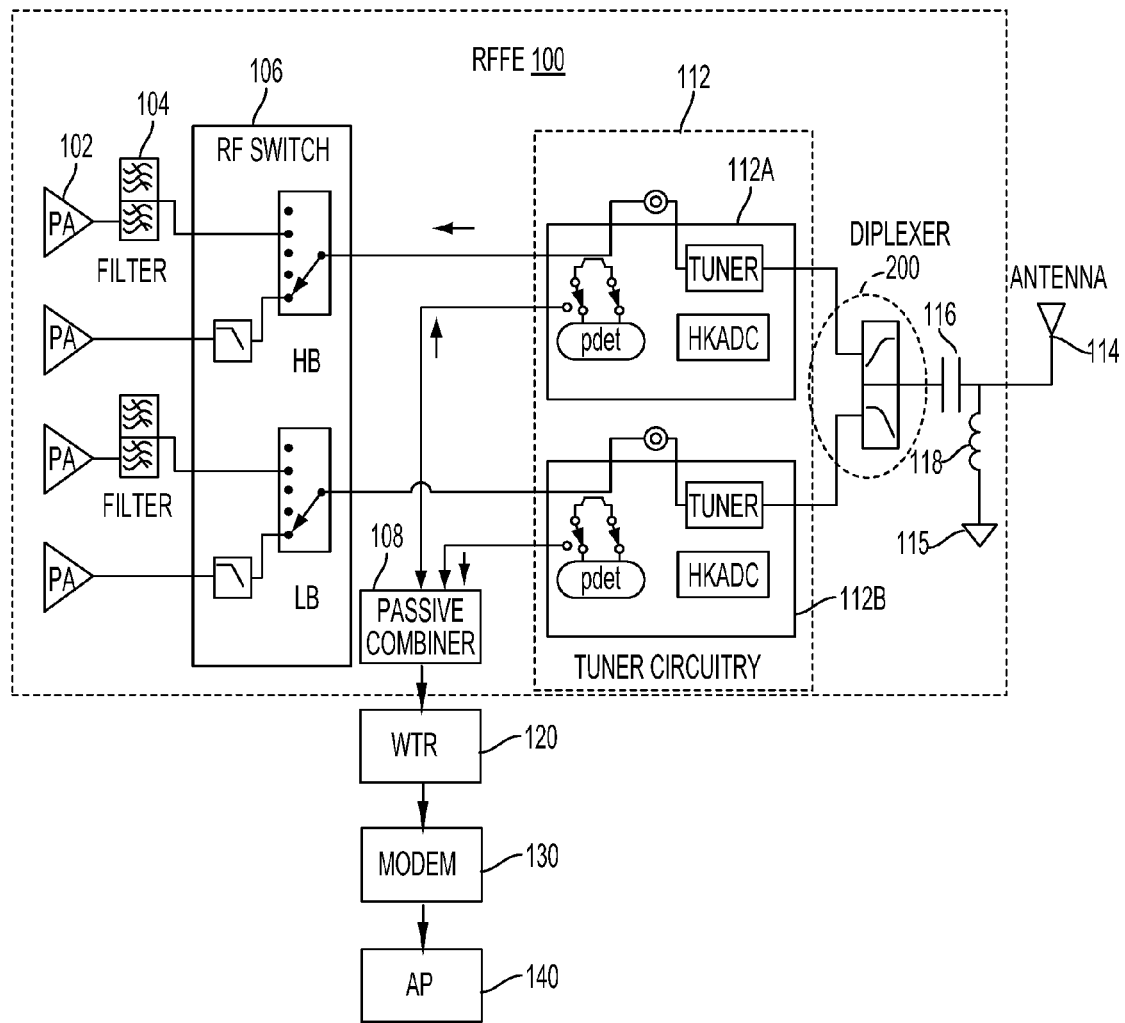
FIG. 1A is a schematic diagram of a radio frequency (RF) front end (RFFE) module employing a diplexer according to an aspect of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Mobile RF chip designs (e.g., mobile RF transceivers), including high performance multiplexers have migrated to a deep sub-micron process node due to cost and power consumption considerations. The design of such mobile RF transceivers becomes complex at this deep sub-micron process node. The design complexity of these mobile RF transceivers is further complicated by added circuit functions to support communication enhancements, such as carrier aggregation. Further design challenges for mobile RF transceivers include analog/RF performance considerations, including mismatch, noise and other performance considerations. The design of these mobile RF transceivers includes the use of additional passive devices, for example, to suppress resonance, and/or to perform filtering, bypassing and coupling.

Successful fabrication of modern semiconductor chip products involves interplay between the materials and the processes employed. In particular, the formation of passive devices during semiconductor fabrication in back-end-of-line (BEOL) processes is an increasingly challenging part of the process flow. This is particularly true in terms of maintaining a small feature size. The same challenge of maintaining a small feature size also applies to passive on glass (POG) technology, where high performance components such as inductors and capacitors are built upon a highly insulative substrate that may also have a very low loss to support mobile RF transceiver design.

Passive on glass devices involve high-performance inductor and capacitor components that have a variety of advantages over other technologies, such as surface mount technology or multi-layer ceramic chips that are commonly used in the fabrication of mobile RF chip designs. The design complexity of mobile RF transceivers is complicated by the migration to a deep sub-micron process node due to cost and power consumption considerations. Spacing considerations also affect mobile RF transceiver design deep sub-micron process nodes, such as large capacitor, which may cause a performance bottle-neck during design integration of RF multiplexers.

Capacitors are passive elements used in integrated circuits for storing an electrical charge. Capacitors are often made using plates or structures that are conductive with an insulating material between the plates. The amount of storage, or capacitance, for a given capacitor is contingent upon the materials used to make the plates and the insulator, the area of the plates, and the spacing between the plates. The insulating material is often a dielectric material. Metal-insulator-metal (MIM) capacitors are one example of a parallel plate capacitor, in which the insulator is a dielectric material, and the plates are made of a conductive material (e.g., metal).

Parallel plate capacitors are frequently employed in semiconductor dies to provide capacitance to circuitry on the semiconductor dies. Parallel plate capacitors are increasingly used to improve performance of devices that operate at increasingly higher frequencies. For example, MIM capacitors are often used in high frequency (e.g., radio frequency (RF)) telecommunications applications, such as cell phones, wireless devices, and other telecommunications products. Often, MIM capacitors provide various functions in an integrated circuit such as decoupling with a power supply, analog-to-digital conversions and filtering, and termination of transmission lines. Decoupling applications generally have relatively loose leakage current specifications, whereas analog typically involves closer capacitor matching and relatively good voltage linearity. Moreover, in many telecommunications applications, particularly in handheld applications, low loss and relatively small temperature linearity are desired.

Conventionally, capacitators are designed based on a specification in which the constant and thickness of the dielectric material of the capacitors cannot vary within a device, or on a plane. For an increasing number of applications, however, desired capacitance densities and capacitor sizes may vary from one capacitor to another for a passive device. For example, a high capacitance density may be desired for some capacitors, and high quality (Q)-factors may be desired for others. A combination of high density and high Q-factor may be desired for yet a different set of capacitors.

One such application example is a multiplexer or diplexer of a radio frequency (RF) front end (RFFE) device that accommodates a wide range of radio frequencies (e.g., from a base band of 700 MHz all the way to 20 GHz or higher). For a specific frequency range, there is a desired capacitance density and the desired capacitance density changes as the frequency band in use changes. Thus, it is desirable to tailor the capacitors to meet different capacity density specifications of an application. In some other cases, different capacitance sizes or a reduced capacitance size may be desired within the same passive device to meet a specific design specification.

Aspects of the present disclosure propose variation of the thickness or materials of capacitor dielectrics within a passive device to accommodate a different capacitance density or a reduced capacitor size in the form of a multi-density MIM capacitor. According to one aspect of the present disclosure, only the thickness of the same dielectric material may vary among a set of capacitors on a passive device. One advantage of this approach is that the fabrication process is relatively simple because the process is calibrated to the same dielectric material. According to another aspect of the present disclosure, the constants of the dielectric materials of a set of capacitors on the passive device may vary, while maintaining the same thickness of the dielectric materials.

According to yet another aspect of the present disclosure, both the constant and the thickness of the dielectric materials may vary, to accommodate particular design specifications of an application. One advantage of this approach is accommodation of a wide range of capacitance densities, especially when capacitor size is constrained. Other advantages of the present disclosure include quality improvements for both capacitors and inductors fabricated on the same substrate of a chip. In one configuration, inductors are built near capacitors. The capacitor sizes may be reduced while maintaining a similar capacitance value by increasing the thickness of the dielectric material of the capacitors. In turn this improves the quality factor (Q) of the inductor due to reduced overlap between the inductor trace segments and the capacitor plates.

FIG. 1A is a schematic diagram of a radio frequency (RF) front end (RFFE) module 100 employing a diplexer 200 according to an aspect of the present disclosure. The RF front end module 100 includes power amplifiers 102, duplexer/filters 104, and a radio frequency (RF) switch module 106. The power amplifiers 102 amplify signal(s) to a certain power level for transmission. The duplexer/filters 104 filter the input/output signals according to a variety of different parameters, including frequency, insertion loss, rejection or other like parameters. In addition, the RF switch module 106 may select certain portions of the input signals to pass on to the rest of the RF front end module 100.

The RF front end module 100 also includes tuner circuitry 112 (e.g., first tuner circuitry 112A and second tuner circuitry 112B), the diplexer 200, a capacitor 116, an inductor 118, a ground terminal 115 and an antenna 114. The tuner circuitry 112 (e.g., the first tuner circuitry 112A and the second tuner circuitry 112B) includes components such as a tuner, a portable data entry terminal (PDET), and a house keeping analog to digital converter (HKADC). The tuner circuitry 112 may perform impedance tuning (e.g., a voltage standing wave ratio (VSWR) optimization) for the antenna 114. The RF front end module 100 also includes a passive combiner 108 coupled to a wireless transceiver (WTR) 120. The passive combiner 108 combines the detected power from the first tuner circuitry 112A and the second tuner circuitry 112B. The wireless transceiver 120 processes the information from the passive combiner 108 and provides this information to a modem 130 (e.g., a mobile station modem (MSM)). The modem 130 provides a digital signal to an application processor (AP) 140.

As shown in FIG. 1A, the diplexer 200 is between the tuner component of the tuner circuitry 112 and the capacitor 116, the inductor 118, and the antenna 114. The diplexer 200 may be placed between the antenna 114 and the tuner circuitry 112 to provide high system performance from the RF front end module 100 to a chipset including the wireless transceiver 120, the modem 130 and the application processor 140. The diplexer 200 also performs frequency domain multiplexing on both high band frequencies and low band frequencies. After the diplexer 200 performs its frequency multiplexing functions on the input signals, the output of the diplexer 200 is fed to an optional LC (inductor/capacitor) network including the capacitor 116 and the inductor 118. The LC network may provide extra impedance matching components for the antenna 114, when desired. Then a signal with the particular frequency is transmitted or received by the antenna 114. Although a single capacitor and inductor are shown, multiple components are also contemplated.

Figure 1B:
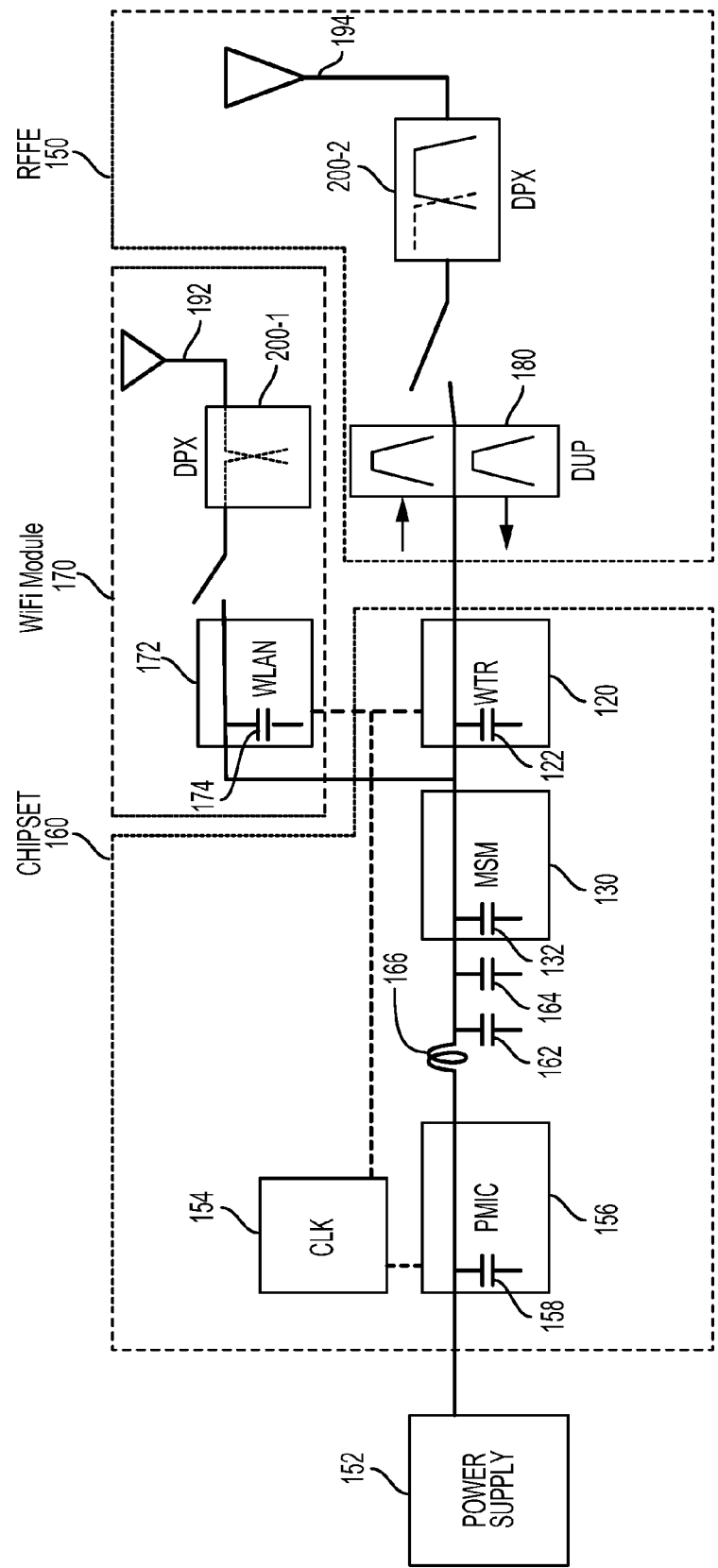
FIG. 1B is a schematic diagram of a radio frequency (RF) front end (RFFE) module employing diplexers for a chipset to provide carrier aggregation according to aspects of the present disclosure.

FIG. 1B is a schematic diagram of a wireless local area network (WLAN) (e.g., WiFi) module 170 including a first diplexer 200-1 and an RF front end (RFFE) module 150 including a second diplexer 200-2 for a chipset 160 to provide carrier aggregation according to an aspect of the present disclosure. The WiFi module 170 includes the first diplexer 200-1 communicably coupling an antenna 192 to a wireless local area network module (e.g., WLAN module 172). The RF front end module 150 includes the second diplexer 200-2 communicably coupling an antenna 194 to the wireless transceiver (WTR) 120 through a duplexer 180. The wireless transceiver 120 and the WLAN module 172 of the WiFi module 170 are coupled to a modem (MSM, e.g., baseband modem) 130 that is powered by a power supply 152 through a power management integrated circuit (PMIC) 156. The chipset 160 also includes capacitors 162 and 164, as well as an inductor(s) 166 to provide signal integrity. The PMIC 156, the modem 130, the wireless transceiver 120, and the WLAN module 172 each include capacitors (e.g., 158, 132, 122, and 174) and operate according to a clock 154. The geometry and arrangement of the various inductor and capacitor components in the chipset 160 may reduce the electromagnetic coupling between the components.

Figure 2A:
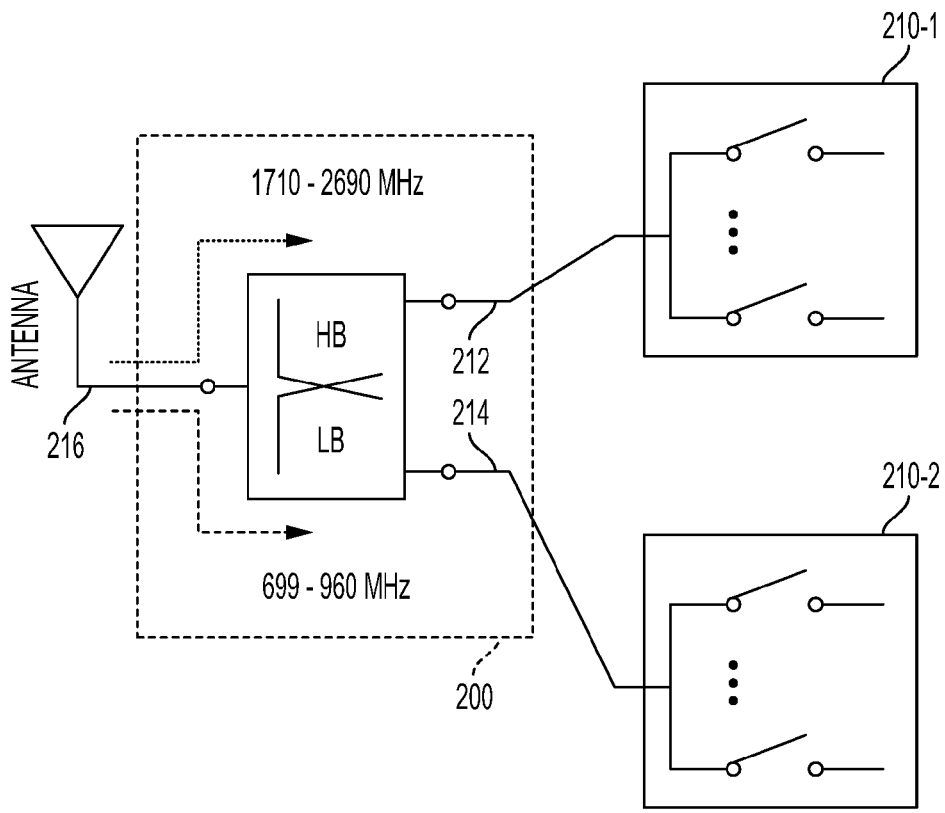
FIG. 2A is a diagram of a diplexer design in accordance with an aspect of the present disclosure.

FIG. 2A is a diagram of a diplexer 200 according to an aspect of the present disclosure. The diplexer 200 includes a high band (HB) input port 212, a low band (LB) input port 214, and an antenna 216. A high band path of the diplexer 200 includes a high band antenna switch 210-1. A low band path of the diplexer 200 includes a low band antenna switch 210-2. A wireless device including an RF front end module may use the antenna switches 210 and the diplexer 200 to enable a wide range band for an RF input and an RF output of the wireless device. In addition, the antenna 216 may be a multiple input, multiple output (MIMO) antenna. Multiple input, multiple output antennas will be widely used for the RF front end of wireless devices to support features such as carrier aggregation.

Figure 2B:
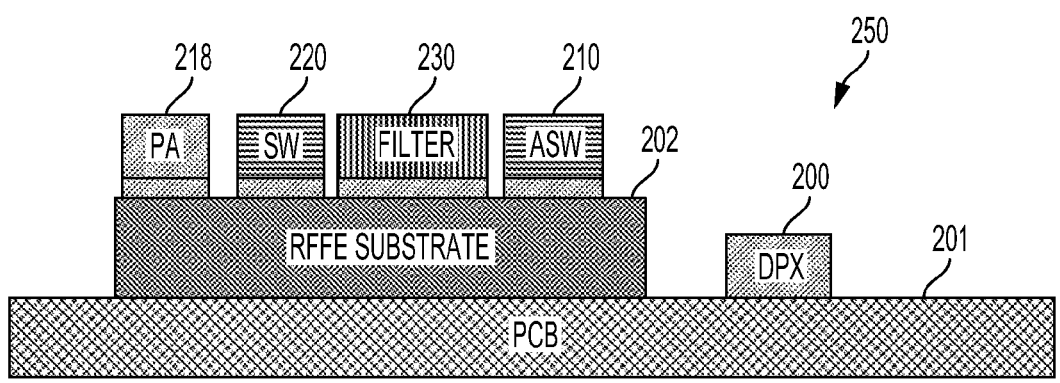
FIG. 2B is a diagram of a radio frequency (RF) front end (RFFE) module in accordance with an aspect of the present disclosure.

FIG. 2B is a diagram of an RF front end module 250 according to an aspect of the present disclosure. The RF front end module 250 includes the antenna switch (ASW) 210 and diplexer 200 (or triplexer) to enable the wide range band noted in FIG. 2A. In addition, the RF front end module 250 includes filters 230, an RF switch 220 and power amplifiers 218 supported by a substrate 202. The filters 230 may include various LC filters, having inductors (L) and capacitors (C) arranged along the substrate 202 for forming a diplexer, a triplexer, low pass filters, balun filters, and/or notch filters to prevent high order harmonics in the RF front end module 250.

In this configuration, the diplexer 200 is implemented as a surface mount device (SMD) on a system board 201 (e.g., printed circuit board (PCB) or package substrate). By contrast, the antenna switch 210 is implemented on the substrate 202 supported by the system board 201 of the RF front end module 250. In addition, the various LC filters of the filters 230 are also implemented as surface mount devices on the substrate 202 of the RF front end module 250. Although shown as filters 230, the LC filters including a low pass filter(s) and/or a notch filter(s) arranged throughout the substrate using pick and place technology to prevent high order harmonics in the RF front end module 250.

Conventionally, the RF front end module 250 would include capacitors that are designed based on a specification in which the constant and thickness of the dielectric material of the capacitors cannot vary within a device, or on a plane. In the RF front end module 250, however, desired capacitance densities and capacitor sizes vary from one capacitor to another of the various passive devices. For example, a high capacitance density may be desired for some capacitors of the diplexer 200, and high quality (Q)-factors may be desired for others, such as the antenna switch 210. A combination of high density and high Q-factor may be desired for yet a different set of capacitors of the RF front end module 250.

According to aspects of the present disclosure, a multiplexer or the diplexer 200 of the RF front end module 250 includes capacitors with variable capacitance densities and sizes for accommodating a wide range of radio frequencies (e.g., from a base band of 700 MHz all the way to 20 GHz or higher). For a specific frequency range, there is a desired capacitance density and the desired capacitance density changes as the frequency band in use changes. Thus, it is desirable to tailor the capacitors to meet different capacity density specifications of an application. In some other cases, different capacity sizes or a reduced capacity size may be desired within the same passive device to meet a specific design specification.

Figure 3:
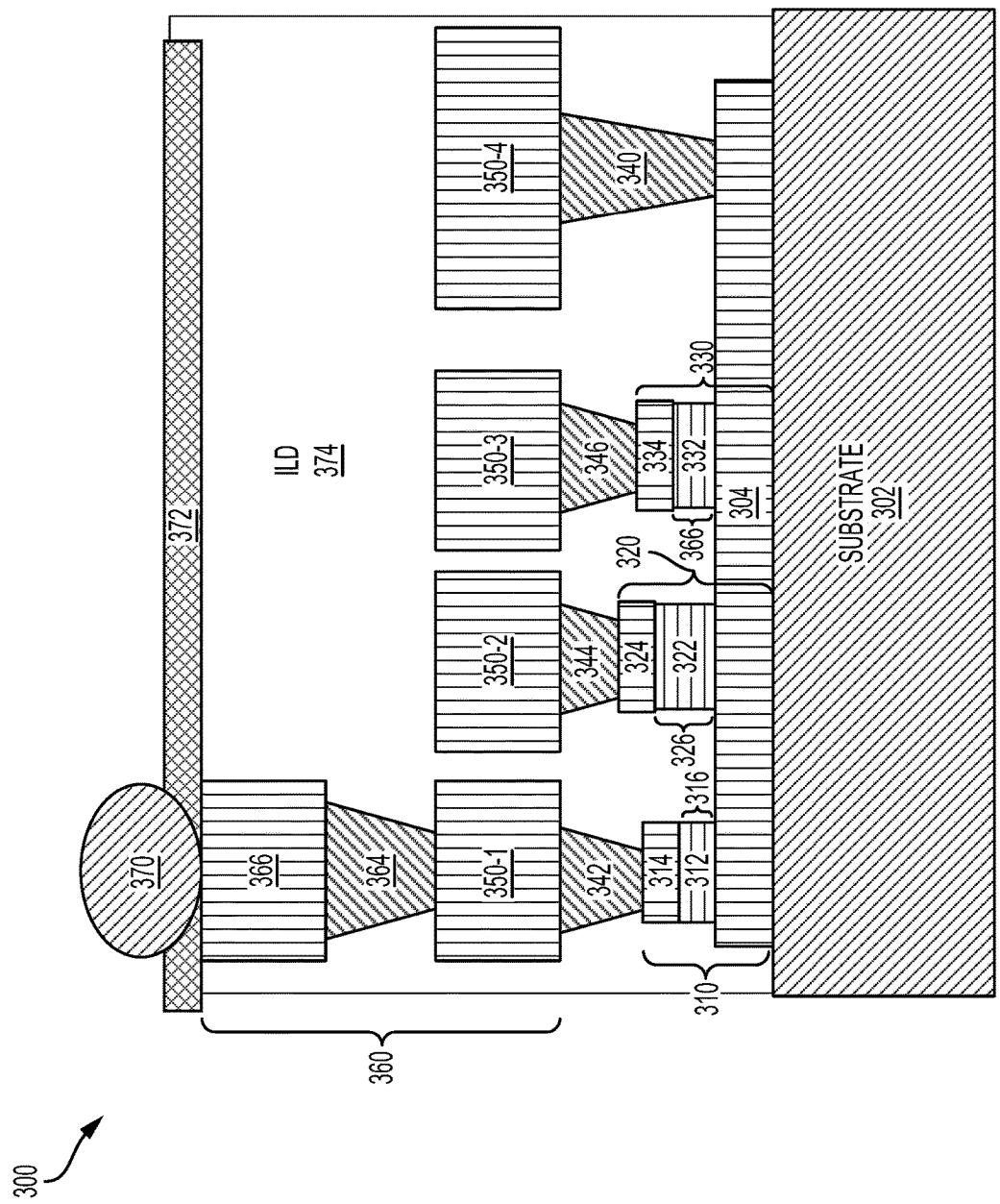
FIG. 3 shows a cross-section view of a multiplexer with capacitors having different dielectric material thicknesses in accordance with an aspect of the present disclosure.
Figure 4:
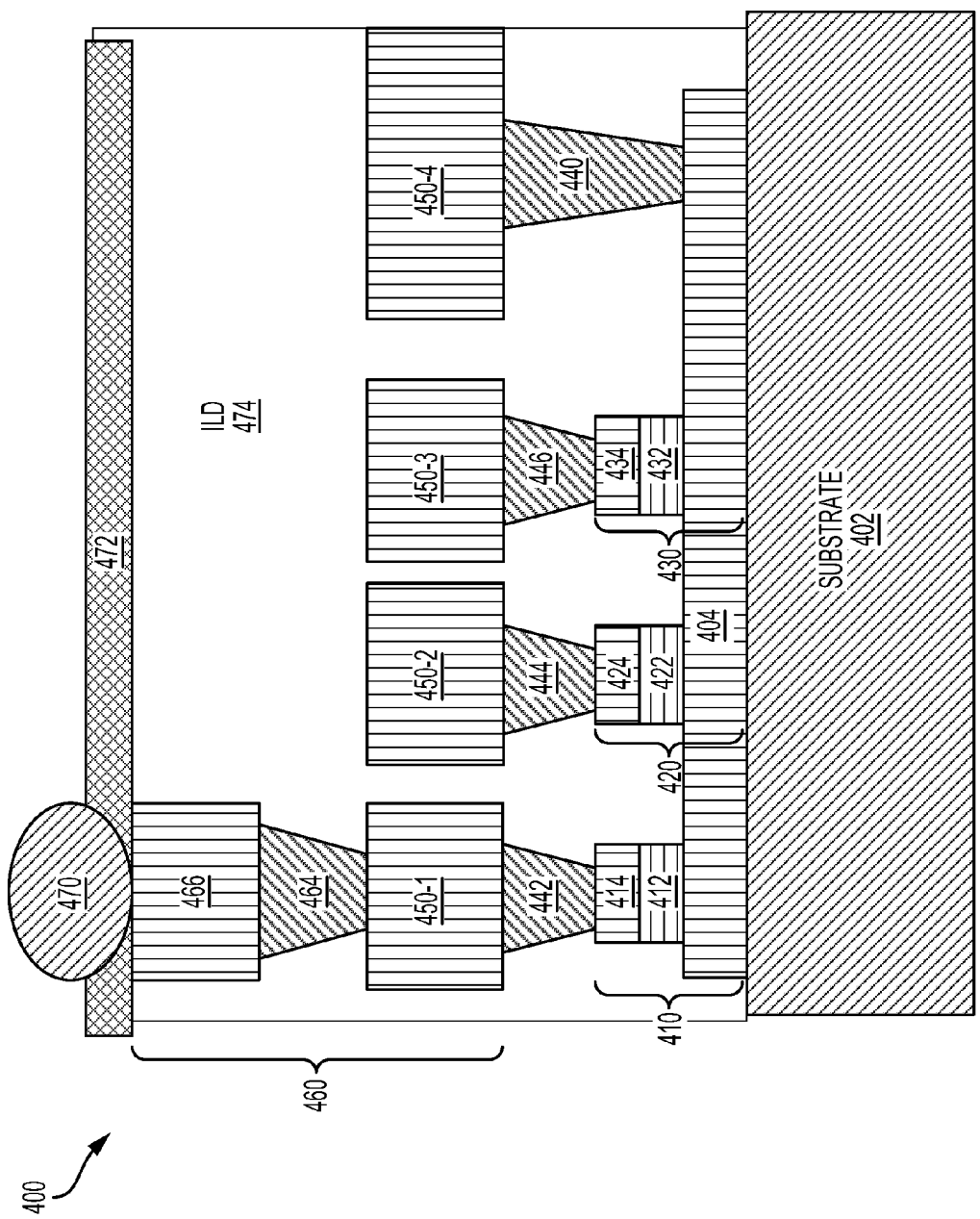
FIG. 4 shows a cross-section view of a multiplexer device with capacitors having different dielectric material constants in accordance with an aspect of the present disclosure.

Various aspects of the present disclosure provide techniques for adapting capacitor materials and/or thickness of the dielectric materials to meet different capacitance density and capacitor size specifications. In one configuration, the thickness of the same dielectric material may vary among a set of capacitors, for example, as shown in FIG. 3. In another configuration, the constants of the dielectric materials between a pair of conductive plates of a set of capacitors may vary, while maintaining the same thickness of the dielectric material, for example, as shown in FIG. 4. These variations may enable a reduced size capacitor (e.g., cap footprint) with the same or similar capacitance density, for example, as shown in FIG. 5.

FIG. 3 shows a cross-section view of a multiplexer 300, in which a thickness of the same dielectric material may vary among a set of capacitors arranged in a common plane according to aspects of the present disclosure. In this configuration, the multiplexer 300 includes three parallel plate capacitors, including a first parallel plate capacitor 310, a second parallel plate capacitor 320, and a third parallel plate capacitor 330. The three capacitors include a shared first conductive plate 304, which is supported by a substrate 302. In this configuration, the shared first conductive plate 304 may be fabricated using a first back-end-of-line (BEOL) interconnect layer (e.g., metal one (M1)), and the substrate 302 may be a glass substrate. The lengths and widths of the passive components (e.g., inductors and capacitors) of the multiplexer 300 are for the purpose of illustration and are not drawn to scale.

As further illustrated in FIG. 3, the first parallel plate capacitor 310 may include the shared first conductive plate 304, a second conductive plate 314, and a first dielectric layer 312, arranged between the shared first conductive plate 304 and the second conductive plate 314. The second parallel plate capacitor 320 is composed of the shared first conductive plate 304, a second conductive plate 324, and a second dielectric layer 322, arranged between the shared first conductive plate 304 and the second conductive plate 324. Similarly, the third parallel plate capacitor 330 is composed of the shared first conductive plate 304, a second conductive plate 334, and a third dielectric layer 332, arranged between the shared first conductive plate 304 and the second conductive plate 334. In one example configuration, the three parallel plate capacitors are metal insulator metal (MIM) capacitors. In this configuration, the second conductive plate 314, the second conductive plate 324, and the second conductive plate 334 may be fabricated using a second back-end-of-line interconnect layer (e.g., metal two (M2)).

According to aspects of the present disclosure, the first dielectric layer 312, the second dielectric layer 322, and the third dielectric layer 332 are composed of the same dielectric material, having the same dielectric constant. The dielectric material may be a high-K dielectric material such as silicon nitride (SiN), aluminum oxide (AlO) or tantalum pentoxide ($Ta_2O_5$), or other like dielectric material. In one example configuration, the first dielectric layer 312, the second dielectric layer 322, and the third dielectric layer 332 have different thicknesses. As described herein, the term thickness may refer to a distance between the shared first conductive plate 304 and the second conductive plate (e.g., 314, 324, or 334), occupied by the first dielectric layer 312, the second dielectric layer 322, or the third dielectric layer 332.

As shown in FIG. 3, the first dielectric layer 312 has a first dielectric thickness 316, the second dielectric layer 322 has a second dielectric thickness 326, and the third dielectric layer 332 has a third dielectric thickness 336. In this configuration, the first dielectric thickness 316, the second dielectric thickness 326, and the third dielectric thickness 336 are different from each other. For example, the second dielectric thickness 326 is greater than the third dielectric thickness 336, which is greater than the first dielectric thickness 316 According to aspects of the present disclosure, the dielectric layer thickness of the first, second, and third capacitors are selected to meet different capacitance density specifications for a given RF application, such as the multiplexer 300. In one example configuration, the first dielectric thickness 316, the second dielectric thickness 326, and third dielectric thickness 336 may range from 0.1 micrometers (μm) to twenty (20) μm.

FIG. 3 also shows an inductor 360 of the multiplexer 300. The inductor 360 is composed of a first portion 350-1 of a third conductive layer 350, a fourth conductive layer 366, and a via 364 arranged between the first portion 350-1 of the third conductive layer 350 and the fourth conductive layer 366. A conductive bump 370 is coupled to the fourth conductive layer 366 to enable a package connection. In one example configuration, the inductor 360 may be a conductive (e.g., copper) redistribution layer (RDL) inductor. In this configuration, the third conductive layer 350 may be fabricated using a third back-end-of-line interconnect layer (e.g., metal three (M3)). In addition, the fourth conductive layer 366 may be fabricated using a fourth back-end-of-line interconnect layer (e.g., metal four (M4)).

The multiplexer 300 also includes a first via 342 that couples the second conductive plate 314 to the first portion 350-1 of the third conductive layer 350; a second via 344 that couples the second conductive plate 324 to a second portion 350-2 of the third conductive layer 350; and a third via 346 that couples the second conductive plate 334 to a third portion 350-3 of the third conductive layer 350. In one example configuration, a fourth portion 350-4 of the third conductive layer 350 enables access to the shared first conductive plate 304 through a fourth via 340. The multiplexer 300 includes a passivation layer 372 provided on an interlayer dielectric (ILD) 374 surrounding the passive components of the multiplexer 300.

FIG. 4 shows a cross-section view of a multiplexer 400 including a set of parallel plate capacitors arranged within the same plane, but using different dielectric materials, according to aspects of the present disclosure. In this configuration, the multiplexer 400 also includes a first parallel plate capacitor 410, a second parallel plate capacitor 420, and a third parallel plate capacitor 430. The three capacitors each include a shared first conductive plate 404, which is supported by a substrate layer 402. In this configuration, the shared first conductive plate 404 is fabricated using the first back-end-of-line interconnect layer M1, and the substrate 402 is a glass substrate.

As further illustrated in FIG. 4, the first parallel plate capacitor 410 includes the shared first conductive plate 404, a second conductive plate 414, and a first dielectric layer 412, arranged between the shared first conductive plate 404 and the second conductive plate 424. The second parallel plate capacitor 420 is composed of the shared first conductive plate 404, a second conductive plate 424, and a second dielectric layer 422, arranged between the shared first conductive plate 404 and the second conductive plate 424. Similarly, the third parallel plate capacitor 430 is composed of the shared first conductive plate 404, a second conductive plate 434, and a third dielectric layer 432, arranged between the shared first conductive plate 404 and the second conductive plate 434. In this configuration, the second conductive plate 414, the second conductive plate 424, and the second conductive plate 434 are fabricated using the second back-end-of-line interconnect layer M2.

According to aspects of the present disclosure, the first dielectric layer 412, the second dielectric layer 422, and the third dielectric layer 432 are of the same thickness, but are fabricated using different dielectric materials having different dielectric constants. For example, the first dielectric layer 412 may have a first dielectric constant, the second dielectric layer 422 may have a second dielectric constant, and the third dielectric layer 432 may have a third dielectric constant. In an example configuration, a set of metal-insulator-metal (MIM) capacitors (e.g., 410, 420, and 430) are arranged in a common plane. A first MIM capacitor (e.g., 410) of the set of MIM capacitors includes a first single layer of dielectric material (e.g., 412) of a first dielectric constant. A second MIM capacitor (e.g., 420) of the set of MIM capacitors has a second, single layer of dielectric material (e.g., 422) of a second dielectric constant that differs from the first dielectric constant.

The different dielectric materials may include, but are not limited to, silicon nitride (SiN), aluminum oxide (AlO), tantalum pentoxide ($Ta_2O_5$), silicon dioxide, hafnium silicate, zirconium silicate, hafnium dioxide, and zirconium dioxide, among others. According to this aspect of the present disclosure, the first parallel plate capacitor 410, the second parallel plate capacitor 420, and the third parallel plate capacitor 430 are fabricated with different dielectric materials having different dielectric constants to meet different capacitance density and capacitor size specifications of an RF application, such as the multiplexer 400.

FIG. 4 also shows an inductor 460 of the multiplexer 400. The inductor 460 is composed of a first portion 450-1 of a third conductive layer 450, a fourth conductive layer 466, and a via 464 arranged between the first portion 450-1 of the third conductive layer 450 and the fourth conductive layer 466. A conductive bump 470 is coupled to the fourth conductive layer 466 to enable a package connection. In one example configuration, the inductor 460 may be a conductive (e.g., copper) redistribution layer inductor. In this configuration, the third conductive layer 450 is fabricated using the third back-end-of-line interconnect layer M3. In addition, the fourth conductive layer 466 may be fabricated using the fourth back-end-of-line interconnect layer M4.

The multiplexer 400 also includes a first via 442 that couples the second conductive plate 414 to the first portion 450-1 of the third conductive layer 450; a second via 444 that couples the second conductive plate 424 to a second portion 450-2 of the third conductive layer 450; and a third via 446 that couples the second conductive plate 434 to a third portion 450-3 of the third conductive layer 450. In one example configuration, a fourth portion 450-4 of the third conductive layer 450 enables access to the shared first conductive plate 404 through a fourth via 440. The multiplexer 400 includes a passivation layer 472 provided on an interlayer dielectric (ILD) 474 surrounding the passive components of the multiplexer 300.

Figure 5B:
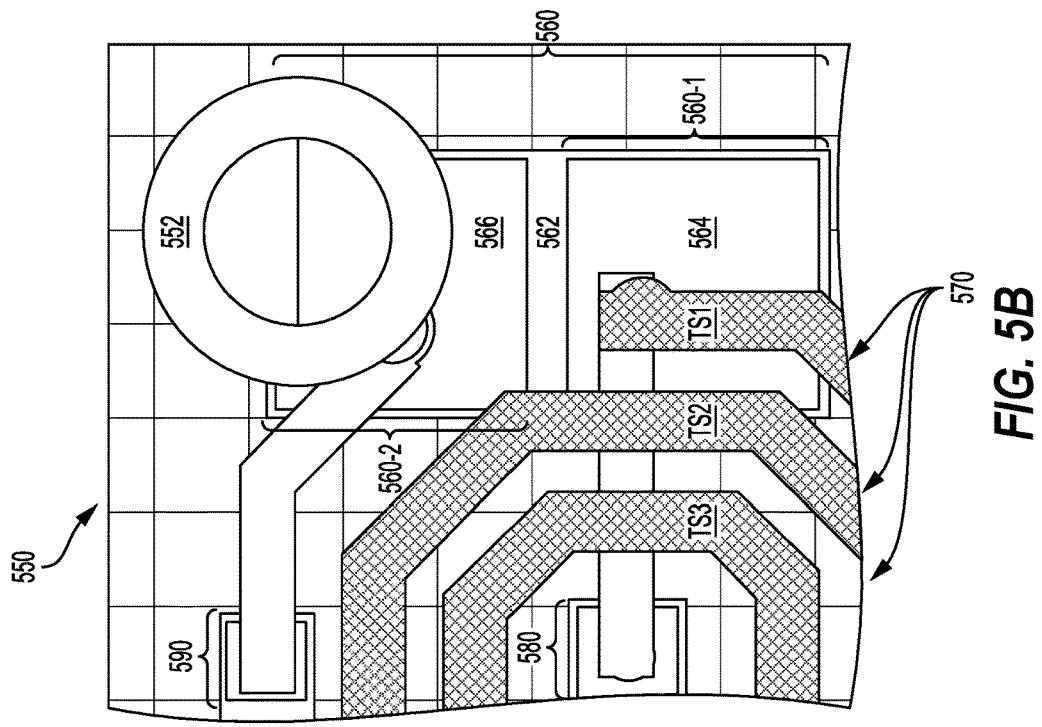
FIGS. 5A and 5B show top-down views of multiplexers according to aspects of the present disclosure.
Figure 5A:
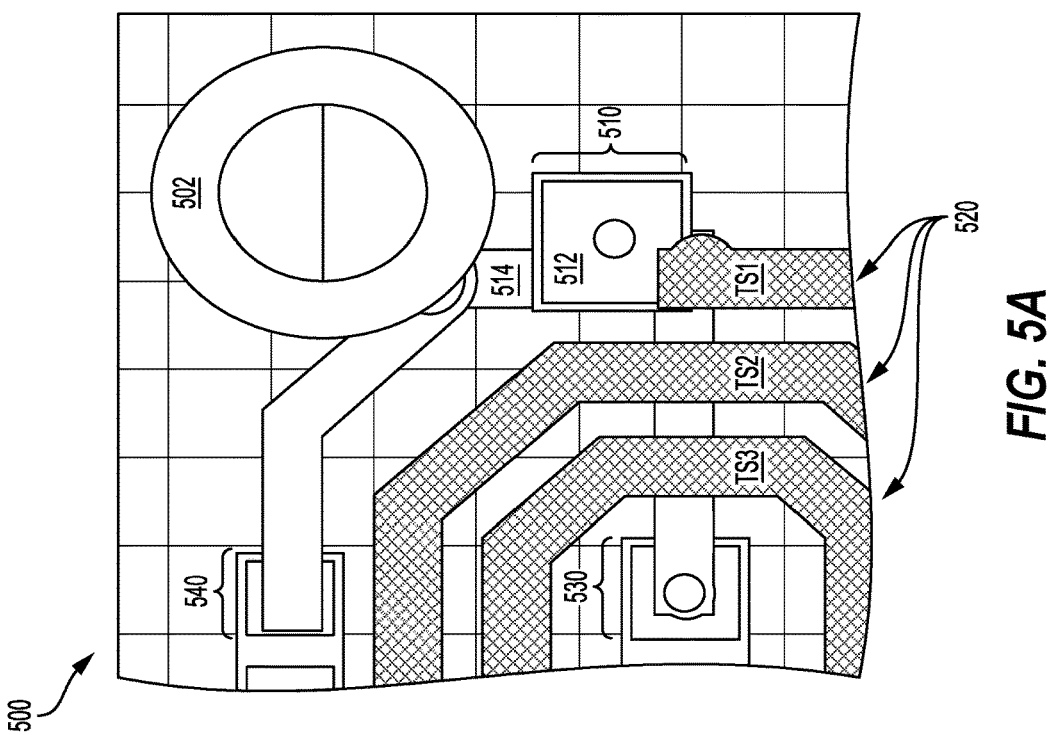

FIGS. 5A and 5B illustrate top-down views of a first multiplexer 500 and a second multiplexer 550, respectively, with different levels of overlap between capacitors and inductors according to aspects of the present disclosure. Again, the first multiplexer 500 and the second multiplexer 550 are provided for the purpose of illustration and are not drawn to scale. Each of the top-down views in FIGS. 5A and 5B show an output port 502 and 552, and multiple conductive plates and traces that form parallel plate capacitors and inductors of the first multiplexer 500 and the second multiplexer 550, respectively.

Referring to FIG. 5B, the second multiplexer 550 includes a first parallel plate capacitor 580, a second parallel plate capacitor 590, and shared plate, series coupled parallel plate capacitors 560. In this configuration, the series coupled, parallel plate capacitors overlap trace segments (TS1, TS2, TS3) of a planar two-dimensional (2D) spiral inductor 570. A first shared plate capacitor 560-1 is composed of a shared first conductive plate 562 and a second conductive plate 564. In addition, a second shared plate capacitor 560-2 is composed of the shared first conductive plate 562 and a second conductive plate 566. The series coupled parallel plate capacitors 560 are arranged to provide a capacitance density specified by the design of the second multiplexer 550. In this configuration, the shared first conductive plate 562, the second conductive plate 564, and the second conductive plate 566 of the series coupled parallel plate capacitors 560 substantially overlap with a first trace segment TS1 and a second trace segment TS2 of the 2D spiral inductor 570.

In this example configuration, the dielectric thickness of the series coupled parallel plate capacitors 560 is fixed and may not be varied to accommodate a particular capacitance density or capacity size specification of an RF application. As a result, the series coupled parallel plate capacitors 560 overlap an entirety of the first trace segment TS1 and a portion of the second trace segment TS2 of the 2D spiral inductor 570. Unfortunately, this overlapping arrangement of the series coupled parallel plate capacitors 560 and the trace segments TS1 and TS2 of the 2D spiral inductor 570 substantially degrades the performance of the 2D spiral inductor 570, resulting in reduced quality (Q) factor and degraded insertion loss of the Multiplexer.

Referring to FIG. 5A, the first multiplexer 500 includes a first parallel plate capacitor 530, a second parallel plate capacitor 540, and a variable dielectric thickness, parallel plate capacitor 510. The variable dielectric thickness, parallel plate capacitor 510 is composed of a first conductive plate 512, a variable thickness dielectric layer, and a second conductive plate 514. Similar to FIG. 5B, the first multiplexer 500 also includes a planar two-dimensional (2D) spiral inductor 520 composed of a first trace segment TS1, a second trace segment TS2, and a third trace segment TS3.

In contrast to the second multiplexer 550, the first multiplexer 500 is arranged with a reduced overlap between variable dielectric thicknesses, parallel plate capacitor 510 and the trace segments (TS1, TS2, TS3) of the 2D spiral inductor 520. According to one aspect of the present disclosure, the variable dielectric thickness, parallel plate capacitor 510 may correspond to the first parallel plate capacitor 310 of the multiplexer 300 of FIG. 3. In one example configuration, the dielectric layer thickness of the parallel plate capacitor 510 is decreased to meet a particular capacitance density and capacitor size specification. As a result, the parallel plate capacitor 510 has a reduced overlap with the trace segments (TS1, TS2, and TS3) of the 2D spiral inductor 520. In particular, the parallel plate capacitor 510 overlaps only a portion of the first trace segment TS1 of the 2D spiral inductor 520.

In one example configuration, the overlapping area may be expressed as a percentage of the total area of a conductive plate of a capacitor. In another configuration, the overlapping area may be expressed as specific measurement, such as 0.1 micron (μm). In yet another configuration, the overlapping area may be expressed in terms of a number of trace segments of a spiral inductor. For example, the parallel plate capacitor 510 is said to overlap the 2D spiral inductor 520 by a portion of the first trace segment TS1, and the series coupled parallel plate capacitors 560 are said to overlap the 2D spiral inductor 570 by more than one trace segment.

Figure 6:
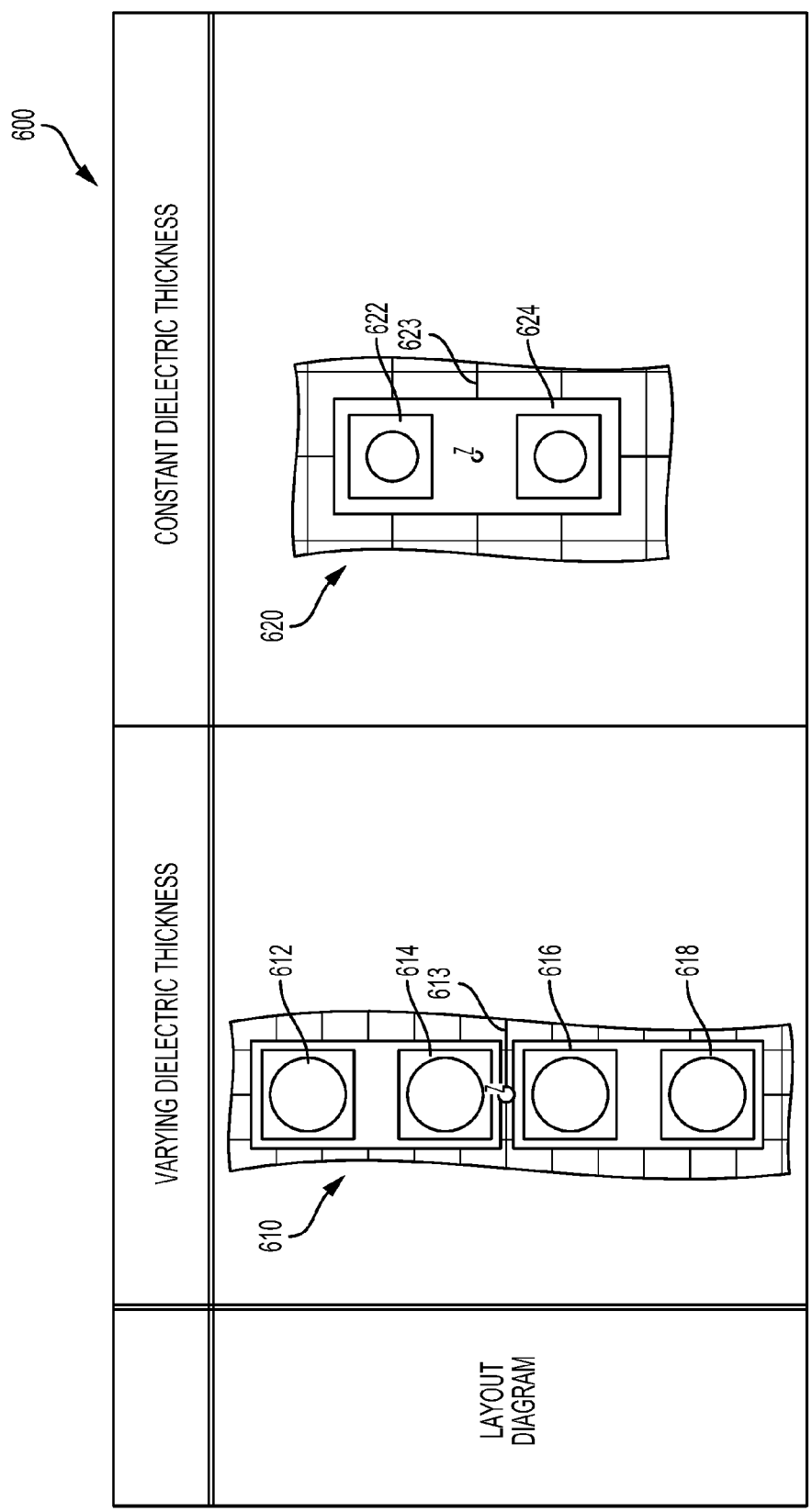
FIG. 6 shows a top-down view of two passive devices in accordance with an aspect of the present disclosure.

FIG. 6 shows a top-down view 600 of first series coupled capacitors 610 and second series coupled capacitors 620, according to one aspect of the present disclosure. In one example aspect of the disclosure, the second series coupled capacitors 620 have a fixed thickness. For example, a fixed dielectric layer thickness of 50×50 μm may be achieved with two SiNx capacitors that have a fixed, large gap 623 between the two capacitors 622 and 624.

Still referring to FIG. 6, the first series coupled capacitors 610 have an increased dielectric layer thickness to achieve a different capacitance density and packet size specification. For example, the thickness of the dielectric layer is increased by connecting four capacitors 612, 614, 616, and 618 in series on the same plate, with a reduced gap 613 between the capacitor 614 and the capacitor 616. An example configuration, such as the one shown in the first series coupled capacitors 610, may result in a thicker dielectric layer and bigger capacitor size. This may in turn achieve a better tolerance and capacitance density control for the passive devices, which is desirable for some applications. In one example configuration, the first series coupled capacitors 610 may have a thickness of 100 μm×100 μm when the four capacitors 612, 614, 616, and 618 are connected on the same plate in series with the reduced gap 613 between the capacitors.

Figure 7:
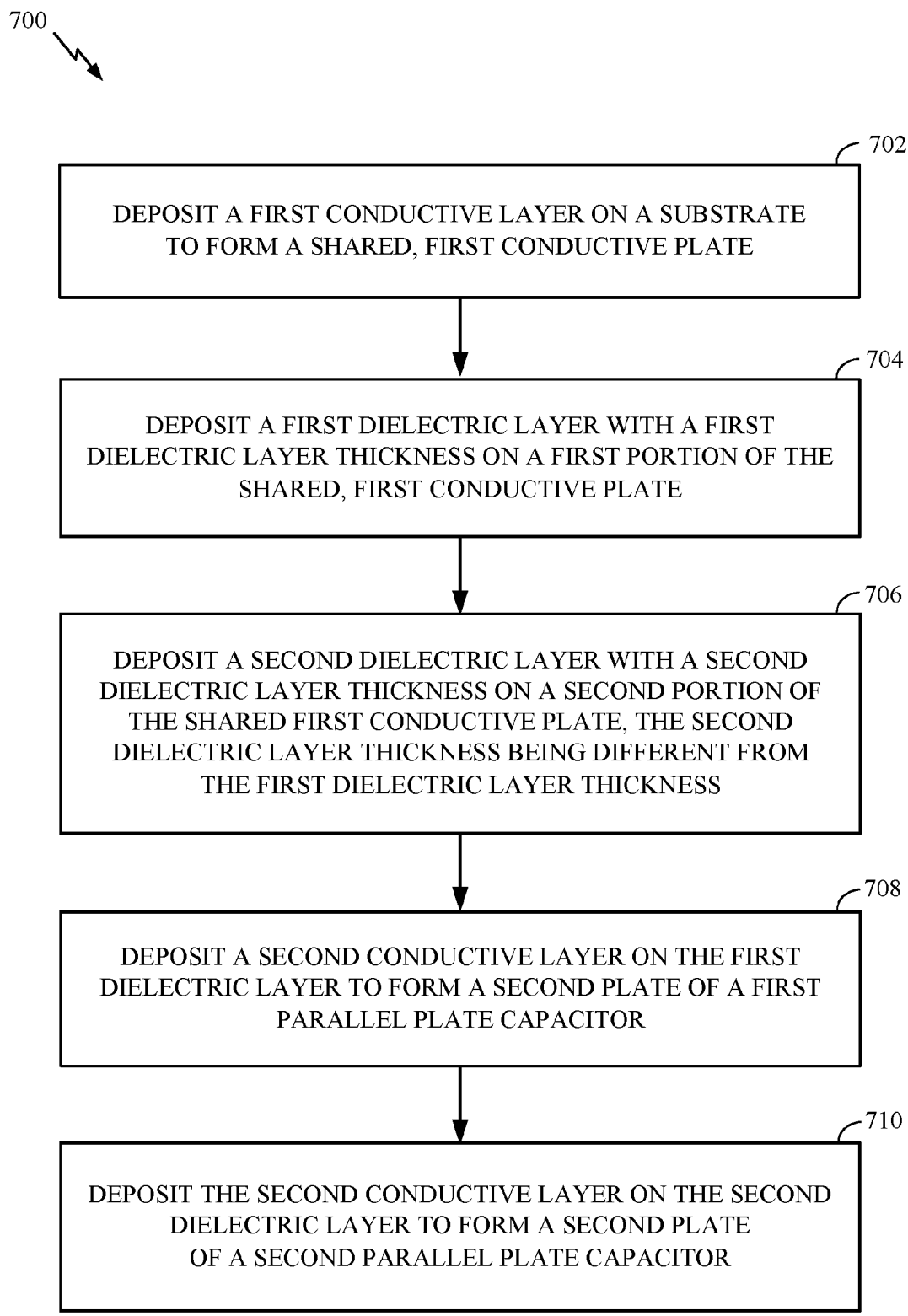
FIG. 7 illustrates a method of a fabricating a passive device with multiple capacitors in accordance with an aspect of the present disclosure.

FIG. 7 is a method for making a passive device with multiple capacitors having varying thicknesses. In block 702, a first conductive layer is deposited on a substrate to form a shared, first conductive plate. The substrate may be the substrate 302 and the shared, first conductive plate may be the shared first conductive plate 304 of FIG. 3. In block 704, a first dielectric layer, having a first dielectric layer thickness, is deposited on a first portion of the shared, first conductive plate. The first dielectric layer may be the first dielectric layer 312 of the first parallel plate capacitor 310 of FIG. 3.

Referring again to FIG. 7, in block 706, a second dielectric layer, with a second thickness, is deposited on a second portion of the shared, first conductive plate. The second portion of the shared, first conductive plate may be adjacent to the first dielectric layer with a predetermined space between the first dielectric layer and the second dielectric layer. In one example configuration, the first dielectric layer and the second dielectric layer are of the same dielectric material and the second dielectric layer thickness is different from the first dielectric layer thickness. The second dielectric layer may be the second dielectric layer 322 of the second parallel plate capacitor 320, having the second dielectric thickness 326, as shown in FIG. 3.

Referring again to FIG. 7, in block 708, the method 700 includes depositing a second conductive layer on the first dielectric layer to form a second plate of a first parallel plate capacitor. In block 710, the second conductive layer is deposited on the second dielectric layer to form a second plate of a second parallel plate capacitor. In one example configuration, blocks 708 and 710 form the first parallel plate capacitor 310, having the first dielectric thickness 316, and the second parallel plate capacitor 320, having the second dielectric thickness 326 less than the first dielectric thickness 316, as shown in FIG. 3.

Conventional capacitors are designed based on a specification in which the constant and thickness of the dielectric material of the capacitors cannot vary within a device or a plane. For an increasing number of applications, however, desired capacitance densities and capacitor sizes may vary from one capacitor to another within, for example, a passive RF device. For example, a high capacitance density may be desired for some capacitors, and high quality (Q)-factors may be desired for others. A combination of a high density and a high Q-factor may be desired for yet a different set of capacitors.

One such application example is a multiplexer or diplexer of a radio frequency (RF) front end (RFFE) device that accommodates a wide range of radio frequencies (e.g., from a base band of 700 MHz all the way to 20 GHz or higher). For a specific frequency range, there is a desired capacitance density and the desired capacitance density changes as the frequency band in use changes. Thus, it is desirable to tailor the capacitors to meet different capacity density specifications of an RF application. In some other cases, different capacitance sizes or a reduced capacitance size may be desired within the same passive device to meet a specific design specification.

Aspects of the present disclosure propose variation of the thickness or materials of capacitor dielectrics within a passive device to accommodate a different capacitance density or a reduced capacitor size in the form of multi-density MIM capacitors. According to one aspect of the present disclosure, only the thickness of the same dielectric material may vary among a set of capacitors. One advantage of this approach is that the fabrication process is relatively simple because the process is calibrated to the same dielectric material. According to another aspect of the present disclosure, the constants of the dielectric materials of a set of capacitors may vary, while maintaining the same thickness of the dielectric materials.

According to yet another aspect of the present disclosure, both the constant and the thickness of the dielectric materials may vary, to accommodate specific design specifications of an application. One advantage of this approach is accommodation of a wide range of capacitance densities, especially when capacitor size is constrained. Other advantages of the present disclosure include quality improvements for both capacitors and inductors fabricated on the same substrate of a chip. In one configuration, inductors are built near capacitors. The capacitor sizes may be reduced while maintaining a similar capacitance value by increasing the thickness of the dielectric material of the capacitor. In turn this may improve the performance of the inductors by reducing an insertion loss of the inductors.

Figure 8:
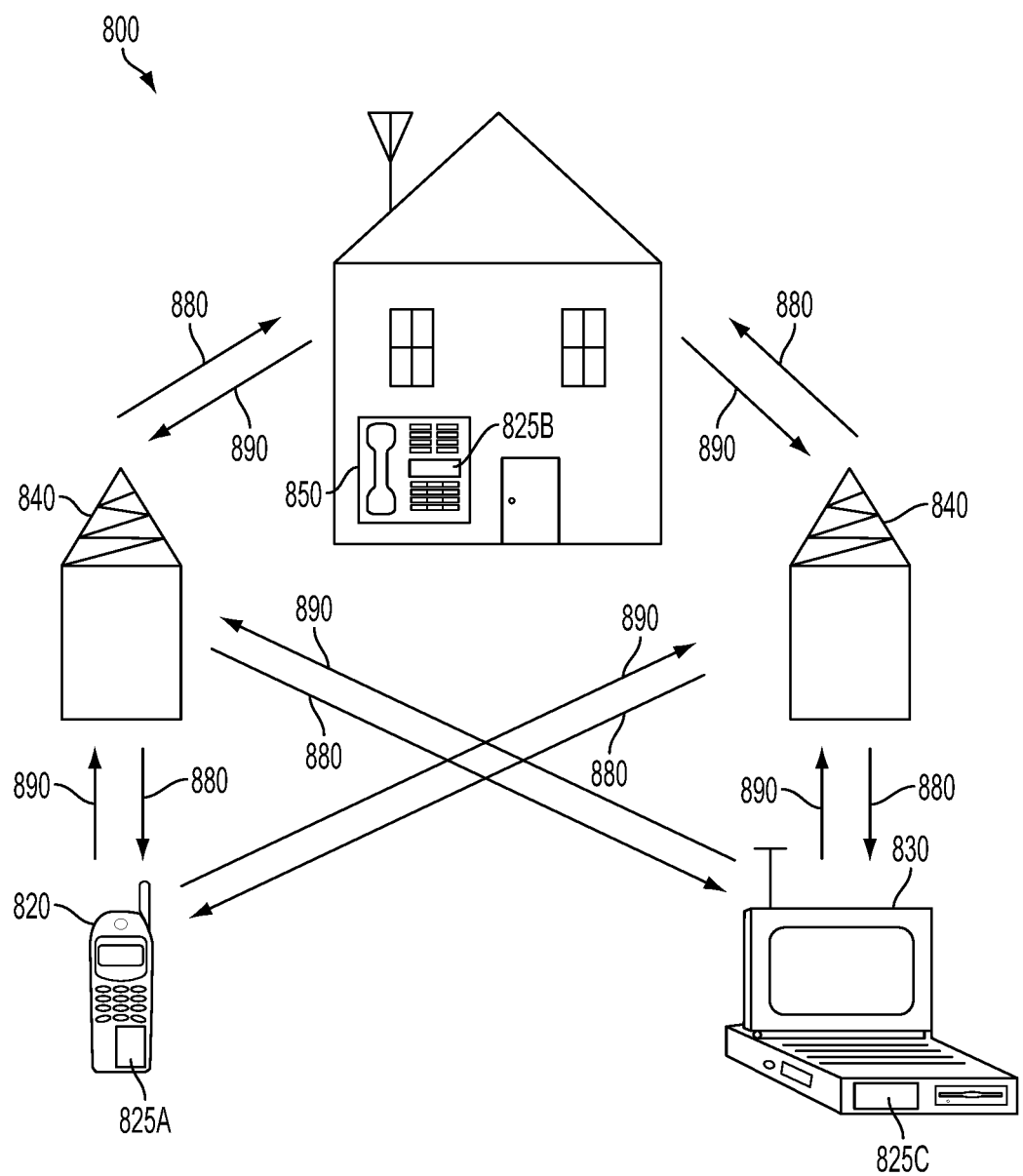
FIG. 8 is a block diagram showing an exemplary wireless communication system in which an aspect of the disclosure may be advantageously employed.

FIG. 8 is a block diagram showing an exemplary wireless communication system 800 in which an aspect of the disclosure may be advantageously employed. For purposes of illustration, FIG. 8 shows three remote units 820, 830, and 850 and two base stations 840. It will be recognized that wireless communication systems may have many more remote units and base stations. Remote units 820, 830, and 850 include IC devices 825A, 825C, and 825B that include the disclosed multi-density MIM capacitors. It will be recognized that other devices may also include the disclosed multi-density MIM capacitors, such as the base stations, switching devices, and network equipment. FIG. 8 shows forward link signals 880 from the base station 840 to the remote units 820, 830, and 850 and reverse link signals 890 from the remote units 820, 830, and 850 to base stations 840.

In FIG. 8, remote unit 820 is shown as a mobile telephone, remote unit 830 is shown as a portable computer, and remote unit 850 is shown as a fixed location remote unit in a wireless local loop system. For example, the remote units may be a mobile phone, a hand-held personal communication systems (PCS) unit, a portable data unit such as a personal digital assistant (PDA), a GPS enabled device, a navigation device, a set top box, a music player, a video player, a communications device, an entertainment unit, a fixed location data unit such as a meter reading equipment, or other devices that store or retrieve data or computer instructions, or combinations thereof. Although FIG. 8 illustrates remote units according to the aspects of the disclosure, the disclosure is not limited to these exemplary illustrated units. Aspects of the disclosure may be suitably employed in many devices, which include the disclosed multi-density MIM capacitors.

Figure 9:
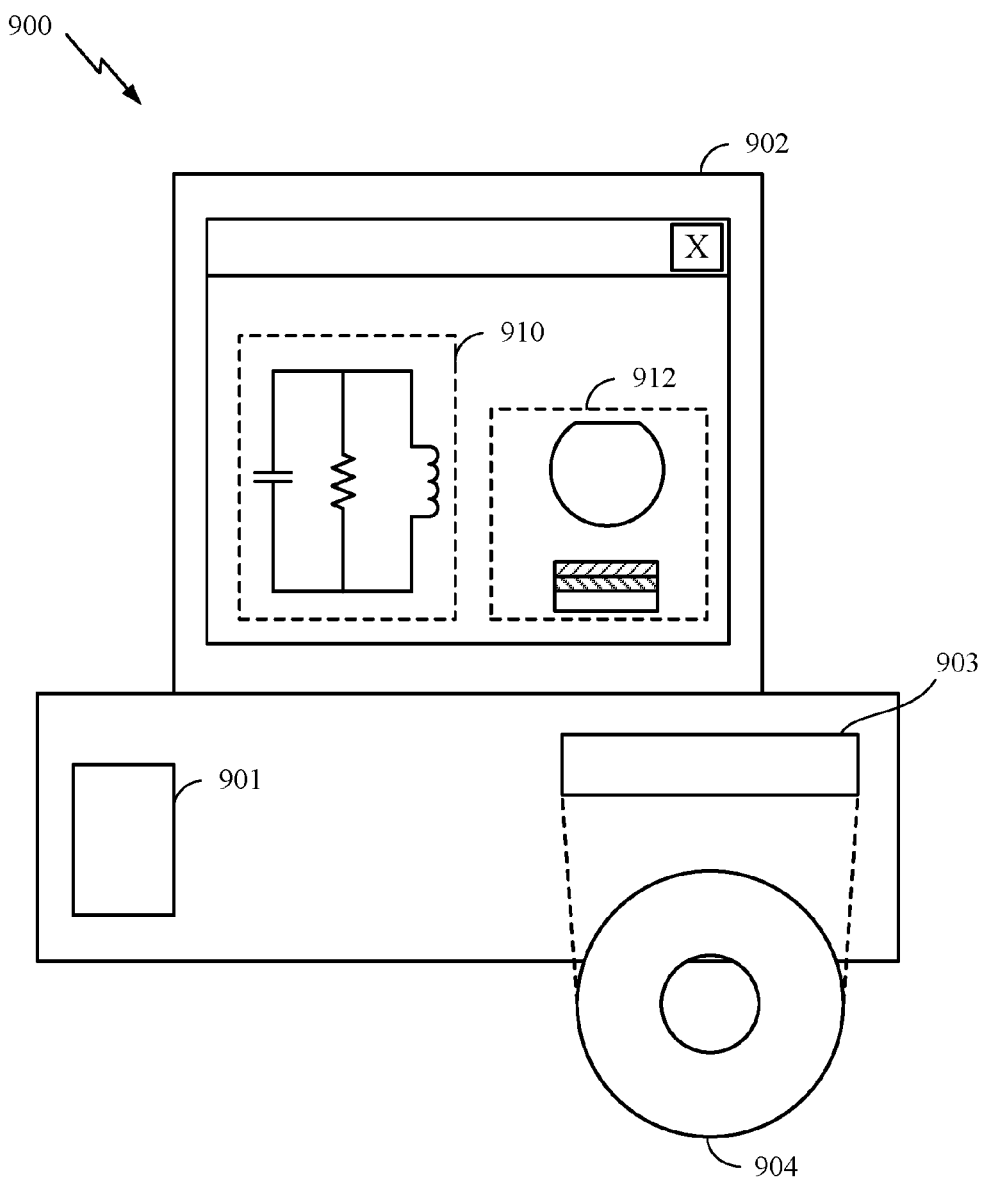
FIG. 9 is a block diagram illustrating a design workstation used for circuit, layout, and logic design of a fin-based structure according to one aspect of the present disclosure.

FIG. 9 is a block diagram illustrating a design workstation used for circuit, layout, and logic design of the multi-density MIM capacitors disclosed above. A design workstation 900 includes a hard disk 901 containing operating system software, support files, and design software such as Cadence or OrCAD. The design workstation 900 also includes a display 902 to facilitate design of a circuit 910 or the multi-density MIM capacitors 912. A storage medium 904 is provided for tangibly storing the design of the circuit 910 or the multi-density MIM capacitors 912. The design of the circuit 910 or the multi-density MIM capacitors 912 may be stored on the storage medium 904 in a file format such as GDSII or GERBER. The storage medium 904 may be a CD-ROM, DVD, hard disk, flash memory, or other appropriate device. Furthermore, the design workstation 900 includes a drive apparatus 903 for accepting input from or writing output to the storage medium 904.

Data recorded on the storage medium 904 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 904 facilitates the design of the circuit 910 or the multi-density MIM capacitors 912 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A passive on glass (POG) device, comprising:
   a spiral inductor comprising a single layer of a plurality of interconnected trace segments; and
   a plurality of parallel plate capacitors, each of the plurality of parallel plate capacitors having a dielectric layer between a pair of conductive plates, and each of the plurality of parallel plate capacitors is overlapped by only one of the plurality of interconnected trace segments of the single layer spiral inductor.

2. The passive device of claim 1, in which the plurality of parallel plate capacitors comprise metal insulator metal (MIM) capacitors having different dielectric constants.

3. The passive device of claim 2, in which the metal insulator metal (MIM) capacitors are composed of different dielectric materials.

4. The passive device of claim 2, in which the metal insulator metal (MIM) capacitors have different dielectric thicknesses.

5. The passive device of claim 1, integrated into a radio frequency (RF) front end module, the RF front end module incorporated into at least one of a music player, a video player, an entertainment unit, a navigation device, a communications device, a personal digital assistant (PDA), a fixed location data unit, a mobile phone, and a portable computer.

6. A radio frequency (RF) front end module, comprising:
   a multiplexer, comprising a spiral inductor including a single layer of a plurality of interconnected trace segments, and a plurality of parallel plate capacitors, each of the plurality of parallel plate capacitors having a dielectric layer between a pair of conductive plates, and each of the plurality of parallel plate capacitors is overlapped by only one of the plurality of interconnected trace segments of the single layer spiral inductor; and
   an antenna coupled to an output of the multiplexer.

7. The RF front end module of claim 6, in which the plurality of parallel plate capacitors comprise metal insulator metal (MIM) capacitors having different dielectric constants.

8. The RF front end module of claim 7, in which the metal insulator metal (MIM) capacitors are composed of different dielectric materials.

9. The RF front end module of claim 7, in which the metal insulator metal (MIM) capacitors have different dielectric thicknesses.

10. The RF front end module of claim 6, incorporated into at least one of a music player, a video player, an entertainment unit, a navigation device, a communications device, a personal digital assistant (PDA), a fixed location data unit, a mobile phone, and a portable computer.

11. A passive device, comprising:
- a set of metal-insulator-metal (MIM) capacitors in a common plane and having a first shared capacitor plate and separate second capacitor plates, a first capacitor having a first dielectric thickness and a first dielectric constant of a first dielectric layer and a second capacitor having a second dielectric thickness of a second dielectric layer, the first dielectric thickness differing from the second dielectric thickness, in which the first dielectric layer and the second dielectric layer are of the same material; and
- a single layer spiral inductor having at least one interconnected trace segment overlapping only one of the MIM capacitors of the set of MIM capacitors.

12. The passive device of claim 11, further comprising a third capacitor having the first dielectric thickness and the first dielectric constant, the third capacitor connected in series with the first capacitor.

13. The passive device of claim 11, in which the first dielectric layer and the second dielectric layer comprise silicon nitride (SiN), aluminum oxide (AlO) and tantalum pentoxide ($Ta_2O_5$).

14. The passive device of claim 11, in which the passive device is part of a multiplexer.

15. The passive device of claim 11, in which the passive device is part of a mobile device.

16. The passive device of claim 11, in which a range of the first dielectric thickness and the second dielectric thickness comprises 0.1 micron to 1 micron.

17. The passive device of claim 11, integrated into a radio frequency (RF) front end module, the RF front end module incorporated into at least one of a music player, a video player, an entertainment unit, a navigation device, a communications device, a personal digital assistant (PDA), a fixed location data unit, a mobile phone, and a portable computer.

18. A passive device, comprising:
- a set of metal-insulator-metal (MIM) capacitors in a common plane and having a first shared capacitor plate and separate second capacitor plates, a first MIM capacitor of the set of MIM capacitors having a first single layer of dielectric material of a first dielectric constant and a second MIM capacitor of the set of MIM capacitors having a second, single layer of dielectric material of a second dielectric constant that differs from the first dielectric constant; and
- a single layer spiral inductor having at least one interconnected trace segment overlapping only one of the MIM capacitors of the set of MIM capacitors.

19. The passive device of claim 18, further comprising a third parallel plate capacitor having the first single layer of dielectric material and the first dielectric constant, the third parallel plate capacitor connected in series with the first MIM capacitor.

20. The passive device of claim 18, in which the passive device is part of a multiplexer.

21. The passive device of claim 18, integrated into a radio frequency (RF) front end module, the RF front end module incorporated into at least one of a music player, a video player, an entertainment unit, a navigation device, a communications device, a personal digital assistant (PDA), a fixed location data unit, a mobile phone, and a portable computer.

* * * * *